(12) United States Patent
Lu et al.

(10) Patent No.: US 12,730,129 B2
(45) Date of Patent: Sep. 8, 2026

(54) PROBE CARD DEVICE HAVING EXPANSION CONFIGURATION AND PROBE HEAD THEREOF

(71) Applicant: CHUNGHWA PRECISION TEST TECH. CO., LTD., Taoyuan City (TW)

(72) Inventors: Yu-Ju Lu, Taoyuan City (TW); Hao-Yen Cheng, Taoyuan City (TW); Rong-Yang Lai, Taoyuan City (TW); Wei-Jhih Su, Taichung City (TW)

(73) Assignee: CHUNGHWA PRECISION TEST TECH. CO., LTD., Taoyuan City (TW)

( * ) Notice: Subject to any disclaimer, the term of this patent is extended or adjusted under 35 U.S.C. 154(b) by 119 days.

(21) Appl. No.: 19/007,567

(22) Filed: Jan. 2, 2025

(65) Prior Publication Data

US 2025/0283915 A1 Sep. 11, 2025

(30) Foreign Application Priority Data

Mar. 8, 2024 (TW) ................................ 113108485

(51) Int. Cl.
*G01R 1/073* (2006.01)

(52) U.S. Cl.
CPC ................................ *G01R 1/07371* (2013.01)

(58) Field of Classification Search
CPC ..................................................... G01R 1/073
See application file for complete search history.

(56) References Cited

U.S. PATENT DOCUMENTS

2005/0035754 A1* 2/2005 Ho .................... G01R 31/2896
324/756.05
2025/0052784 A1* 2/2025 Okuma ............. G01R 1/06761

* cited by examiner

*Primary Examiner* — Minh Q Phan
(74) *Attorney, Agent, or Firm* — Li & Cai Intellectual Property Office

(57) ABSTRACT

A probe head of a probe card device includes two guide board modules spaced apart from each other, a plurality of conductive probes, and an auxiliary probe, the latter two of which are assembled to the two guide board modules. At least one of the conductive probes abuts against a connection circuit of one of the two guide board modules. One end of each of the conductive probes protrudes from one of the two guide board modules and is configured to detachably abut against a device under test (DUT). The auxiliary probe abuts against the connection circuit so as to be electrically coupled to the at least one of the conductive probes. One end of the auxiliary probe is fixed in the one of the two guide board modules, and faces toward and is not in contact with the DUT.

10 Claims, 11 Drawing Sheets

PROBE CARD DEVICE HAVING EXPANSION CONFIGURATION AND PROBE HEAD THEREOF

CROSS-REFERENCE TO RELATED PATENT APPLICATION

This application claims the benefit of priority to Taiwan Patent Application No. 113108485, filed on Mar. 8, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card device, and more particularly to a probe card device having an expansion configuration and a probe head thereof.

BACKGROUND OF THE DISCLOSURE

In a conventional probe card device, a quantity of probes is equal to a quantity of metal pads of a device under test (DUT), and the metal pads of the DUT need to respectively meet different electrical requirements. However, the probes of the conventional probe card device are of substantially the same structure for having a same pressure when used, so that the probes are difficult to be adjusted or changed according to the different electrical requirements.

SUMMARY OF THE DISCLOSURE

In response to the above-referenced technical inadequacies, the present disclosure provides a probe card device having an expansion configuration and a probe head thereof for effectively improving on the issues associated with conventional probe card devices.

In order to solve the above-mentioned problems, one of the technical aspects adopted by the present disclosure is to provide a probe card device having an expansion configuration. The probe card includes a circuit board, a first guide board module including a connection circuit, a second guide board module, a plurality of conductive probes, and at least one auxiliary probe. The second guide board module is spaced apart from the first guide board module along a thickness direction and is arranged between the circuit board and the first guide board module. The conductive probes are assembled to the first guide board module and the second guide board module. At least one of the conductive probes abuts against the connection circuit, and each of the conductive probes includes a fixing segment and a testing segment. The fixing segment protrudes from the second guide board module and is fixed to the circuit board. The testing segment protrudes from the first guide board module and is configured to detachably abut against one of metal pads of a device under test (DUT). The at least one auxiliary probe is assembled to the first guide board module and the second guide board module. The at least one auxiliary probe abuts against the connection circuit so as to be electrically coupled to the at least one of the conductive probes. The at least one auxiliary probe includes a connection segment and an assembling segment. The connection segment protrudes from the second guide board module and is fixed to the circuit board. The assembling segment is fixed in the first guide board module. The assembling segment is configured to face toward the DUT along the thickness direction and is not in contact with the DUT.

In order to solve the above-mentioned problems, another one of the technical aspects adopted by the present disclosure is to provide a probe head of a probe card device having an expansion configuration. The probe head includes a first guide board module including a connection circuit, a second guide board module, a plurality of conductive probes, and at least one auxiliary probe. The second guide board module is spaced apart from the first guide board module along a thickness direction. The conductive probes are assembled to the first guide board module and the second guide board module. At least one of the conductive probes abuts against the connection circuit, and each of the conductive probes includes a fixing segment and a testing segment. The fixing segment protrudes from the second guide board module. The testing segment protrudes from the first guide board module and is configured to detachably abut against one of metal pads of a device under test (DUT). The at least one auxiliary probe is assembled to the first guide board module and the second guide board module. The at least one auxiliary probe abuts against the connection circuit so as to be electrically coupled to the at least one of the conductive probes. The at least one auxiliary probe includes an assembling segment fixed in the first guide board module. The assembling segment is configured to face toward the DUT along the thickness direction and is not in contact with the DUT.

Therefore, any one of the probe head and the probe card device in the present disclosure is provided with the at least one auxiliary probe that is not in contact with the DUT, such that the at least one auxiliary probe can be used to cooperate with at least one of the conductive probes electrically coupled thereto for meeting the electrical requirements, thereby effectively increasing the testing performance of the probe card device.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
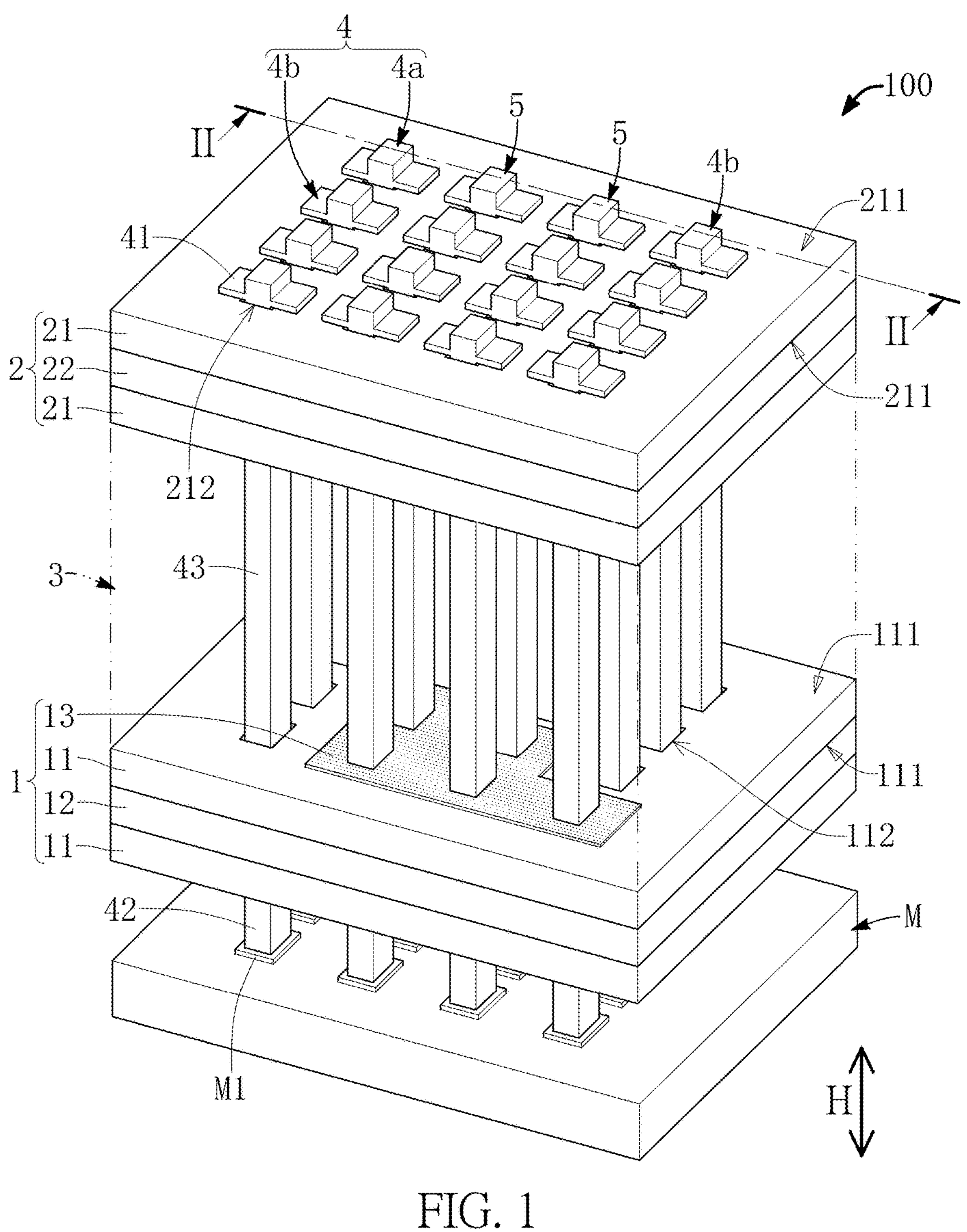
FIG. 1 is a schematic perspective view of a probe head of a probe card device having an expansion configuration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
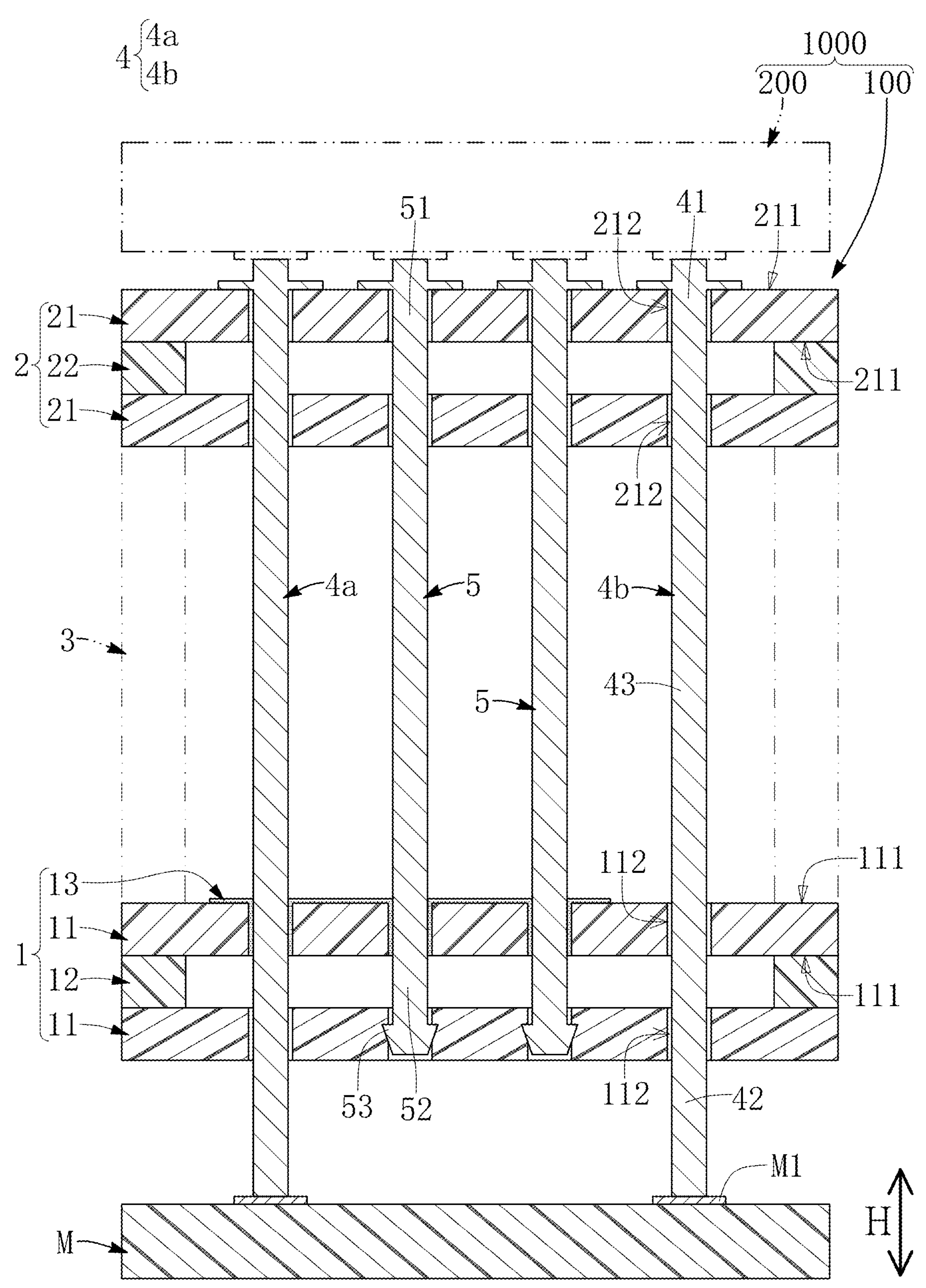
FIG. 2 is a schematic cross-sectional view taken along line II-II of FIG. 1.
Figure 3:
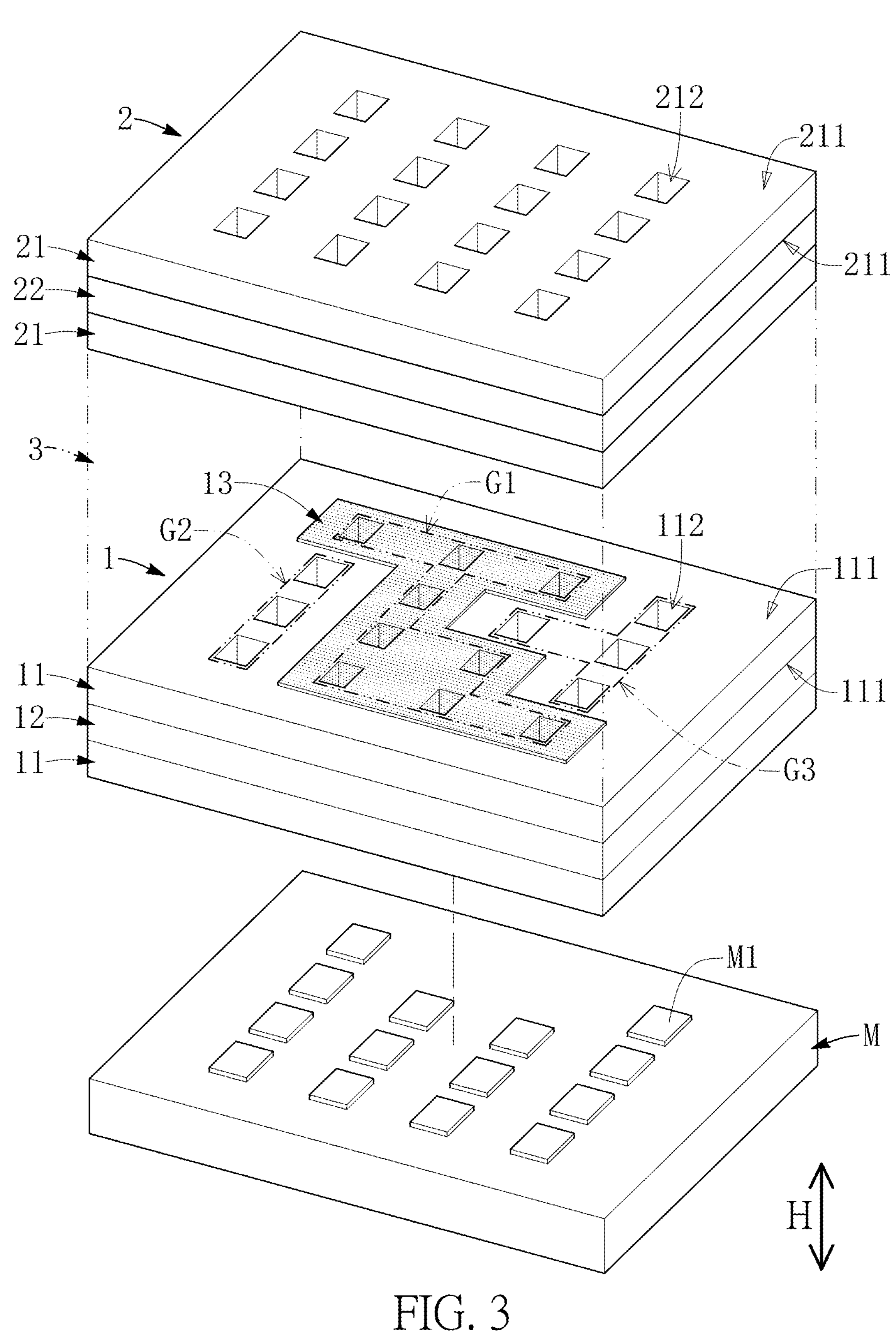
FIG. 3 is a schematic perspective view showing a part of the probe head of FIG. 1.

Referring to FIG. 1 to FIG. 3, a first embodiment of the present disclosure is provided. The present embodiment provides a probe card device 1000 having a parallel connection configuration, which includes a probe head 100 and a circuit board 200 (e.g., a space transformer) that is fixed to one side of the probe head 100. Moreover, another side of the probe head 100 is configured to detachably abut against a device under test (DUT) M for testing the DUT M.

In order to clearly describe the present embodiment, the drawings only depict a partial structure of the probe card device 1000 for clearly showing structural relationships of each component of the probe card device 1000, but the present disclosure is not limited by the drawings. The following description describes the structural relationship of each component of the probe card device 1000.

The probe head 100 includes a first guide board module 1, a second guide board module 2 spaced apart from the first guide board module 1 along a thickness direction H, a spacer 3 sandwiched between the first guide board module 1 and the second guide board module 2, a plurality of conductive probes 4 assembled to the first guide board module 1 and the second guide board module 2, and a plurality of auxiliary probes 5 that are assembled to the first guide board module 1 and the second guide board module 2. The circuit board 200 is arranged adjacent to the second guide board module 2. That is to say, the second guide board module 2 is located between the circuit board 200 and the first guide board module 1.

It should be noted that the spacer 3 can be a frame structure that is sandwiched between a peripheral portion of the first guide board module 1 and a peripheral portion of the second guide board module 2, but the present disclosure is not limited thereto. For example, in other embodiments of the present disclosure not shown in the drawings, the spacer 3 of the probe card device 1000 can be omitted or can be replaced by other components. In addition, the probe head 100 in the present embodiment are described in cooperation with the circuit board 200, but the present disclosure is not limited thereto. For example, in other embodiments of the present disclosure not shown in the drawings, the probe head 100 can be independently used (e.g., sold) or can be used in cooperation with other components.

In the present embodiment, the first guide board module 1 includes two first guide boards 11, a first spacing sheet 12 sandwiched between the two first guide boards 11 along the thickness direction H, and a connection circuit 13 that is formed on one of the two first guide boards 11. The first spacing sheet 12 is sandwiched between peripheral portions of the two first guide boards 11, and the one of the two first guide boards 11 provided with the connection circuit 13 formed thereon is located closer to the second guide board module 2 than another one of the two first guide boards 11.

Moreover, as the two first guide boards 11 in the present embodiment are of substantially the same structure, the following description discloses the structure of the one of the two first guide boards 11 and the connection circuit 13 formed thereon for the sake of brevity, but the present disclosure is not limited thereto. For example, in other embodiments of the present disclosure not shown in the drawings, the two first guide boards 11 can be of different structures; or, each of the two first guide boards 11 can be provided with the connection circuit 13 formed thereon.

Specifically, the first guide board 11 is flat and has two first board surfaces 111 respectively arranged on two opposite sides thereof and a plurality of first thru-holes 112 that penetrate through the two first board surfaces 111 (or that penetrate therethrough). The first thru-holes 112 in the present embodiment preferably have a same size and are in a matrix arrangement, and the first thru-holes 112 are defined into a first thru-hole group G1, a second thru-hole group G2, and a third thru-hole group G3, and the second thru-hole group G2 and the third thru-hole group G3 are separated from each other through the first thru-hole group G1, but the present disclosure is not limited thereto.

Moreover, the connection circuit 13 corresponds in position to the first thru-hole group G1 and is arranged along the first thru-hole group G1. In other words, the connection circuit 13 is formed on a surface of the first guide board 11 along the first thru-hole group G1 and is formed on inner walls of the corresponding first thru-holes 112, such that the connection circuit 13 abuts against and is electrically coupled to the conductive probes 4 and the auxiliary probes 5 that pass through the first thru-hole group G1.

In the present embodiment, the second guide board module 2 includes two second guide boards 21 and a second spacing sheet 22 sandwiched between the two second guide boards 21 along the thickness direction H. Each of the two second guide boards 21 is flat and has two second board surfaces 211 respectively arranged on two opposite sides thereof and a plurality of second thru-holes 212 that penetrate through the two second board surfaces 211 (or that penetrate therethrough). The second spacing sheet 22 is sandwiched between peripheral portions of the two second guide boards 21.

Moreover, the two second guide boards 21 in the present embodiment are of substantially the same structure, and the structure of each of the two second guide boards 21 is substantially identical to the structure of any one of the two first guide boards 11 and is provided without the connection circuit 13 being formed thereon, but the present disclosure is not limited thereto. For example, in other embodiments of the present disclosure not shown in the drawings, the two second guide boards 21 can be of different structures; or, the size of each of the second thru-holes 212 can be different from the size of any one of the first thru-holes 122.

The conductive probes 4 respectively pass through the first thru-holes 112 of each of the two first guide boards 11 and respectively pass through the second thru-holes 212 of each of the two second guide boards 21. Moreover, at least one of the conductive probes 4 abuts against the connection circuit 13. Accordingly, in practical use, each of the conductive probes 4 can be positioned and held through a staggered arrangement of the first guide board module 1 and the second guide board module 2 (not shown in the drawings).

Specifically, each of the conductive probes 4 has a fixing segment 41, a testing segment 42 being opposite to the fixing segment 41, and an extending segment 43 that connects the fixing segment 41 and the testing segment 42. In each of the conductive probes 4, the fixing segment 41 protrudes from (or passes through) the second guide board module 2 and is fixed to the circuit board 200, and the testing segment 42 protrudes from (or passes through) the first guide board module 1 and is configured to detachably abut against one of metal pads M1 of DUT M.

Moreover, in practical use (not shown in the drawings), the testing segment 42 of each of the conductive probes 4 can be positioned and held through a staggered arrangement of the two first guide boards 11, the fixing segment 41 of each of the conductive probes 4 can be positioned and held through a staggered arrangement of the two second guide boards 21, and the extending segment 43 of each of the conductive probes 4 is elastically deformed due to the staggered arrangement of the first guide board module 1 and the second guide board module 2, but the present disclosure is not limited thereto.

In the present embodiment, the conductive probes 4 are of substantially the same structure and include a plurality of grounding probes 4*a* and a plurality of single probes 4*b*, but the present disclosure is not limited thereto. For example, in other embodiments of the present disclosure not shown in the drawings, the conductive probes 4 can be of different structures; or, the conductive probes 4 can further include other probes (e.g., power probes) different from the grounding probes 4*a* and the signal probes 4*b*.

The grounding probes 4*a* and the auxiliary probes 5 pass through the first thru-hole group G1 and abut against the connection circuit 13 for being electrically coupled to each other. In other words, the connection circuit 13 enables the auxiliary probes 5 and the corresponding conductive probes 4 connected thereto to be electrically coupled to each other. Moreover, the signal probes 4*b* respectively pass through the second thru-hole group G2 and the third thru-hole group G3, and are defined into two probe groups that are separated from each other through the grounding probes 4*a*, the connection circuit 13, and the two auxiliary probes 5.

Specifically, the auxiliary probes 5 in the present embodiment are of substantially the same structure, the following description discloses the structure of just one of the auxiliary probes 5 for the sake of brevity, but the present disclosure is not limited thereto. For example, in other embodiments of the present disclosure not shown in the drawings, the auxiliary probes 5 can be of different structures.

In the present embodiment, the auxiliary probe 5 has a connection segment 51 and an assembling segment 52. The connection segment 51 protrudes from (or passes through) the second guide board module 2 and is fixed to the circuit board 200. The assembling segment 52 is fixed in the first guide board module 1, and the assembling segment 52 is configured to face toward the DUT M and is not in contact with the DUT M. In the present embodiment, the assembling segment 52 of the auxiliary probe 5 has at least one thorn 53 that is arranged on a free end thereof and that is fixed to one of the first thru-holes 112 of another one of the two first guide boards 11 that is provided without the connection circuit 13 being formed thereon.

In addition, the conductive probes 4 and the auxiliary probes 5 are jointly in a matrix arrangement, a quantity of the conductive probes 4 is equal to a quantity of the metal pads M1 of the DUT M, and a portion of the DUT M facing toward the two auxiliary probes 5 along the thickness direction H does not have any metal pad M1 arranged thereon. Moreover, an outer diameter of the auxiliary probe 5 is substantially equal to that of any one of the conductive probes 4.

Second Embodiment

Figure 4:
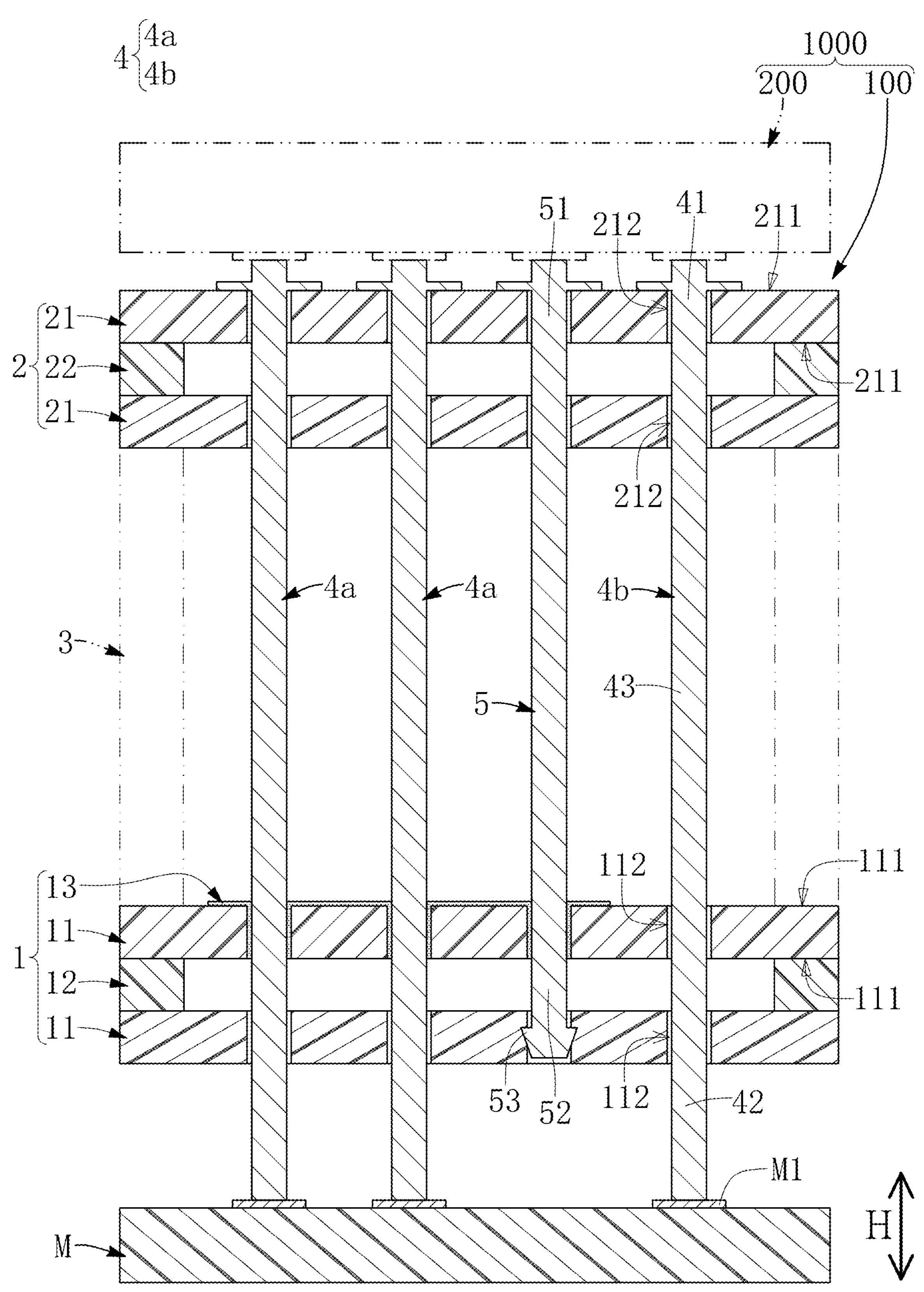
FIG. 4 is a schematic cross-sectional view of the probe card device according to a second embodiment of the present disclosure.
Figure 5:
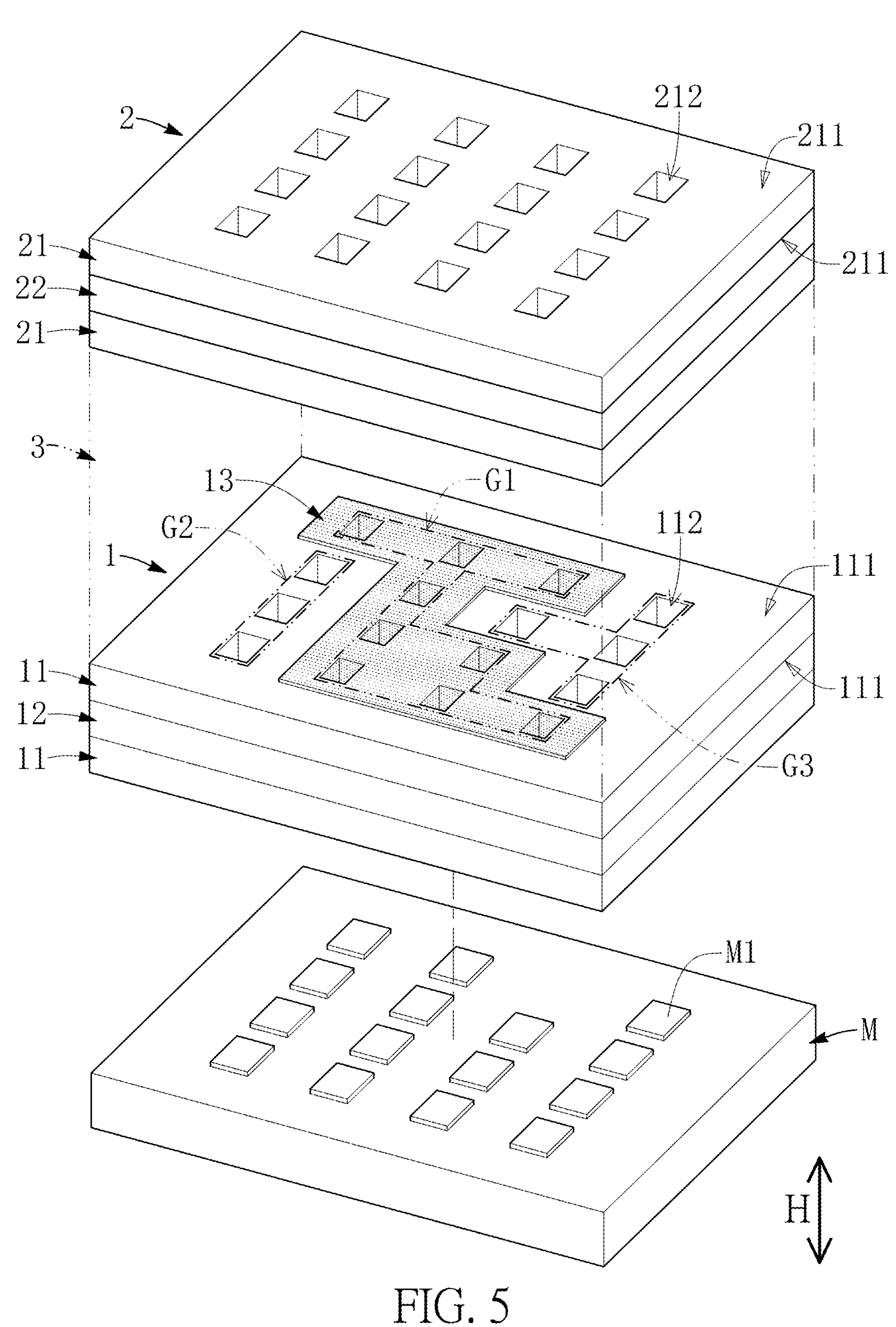
FIG. 5 is a schematic perspective view showing a part of the probe card device according to the second embodiment of the present disclosure.

Referring to FIG. 4 and FIG. 5, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, a quantity of the auxiliary probe 5 in the probe head 100 is one. In other words, according to the present embodiment and the first embodiment, a quantity of the auxiliary probe 5 in the probe head 100 can be at least one. Specifically, a portion of the probe head 100 facing toward the portion of the DUT M (e.g., the portion of the DUT M provided without the metal pads M1 along the thickness direction H) can be added with the auxiliary probe 5 according to practical requirements.

Third Embodiment

Figure 6:
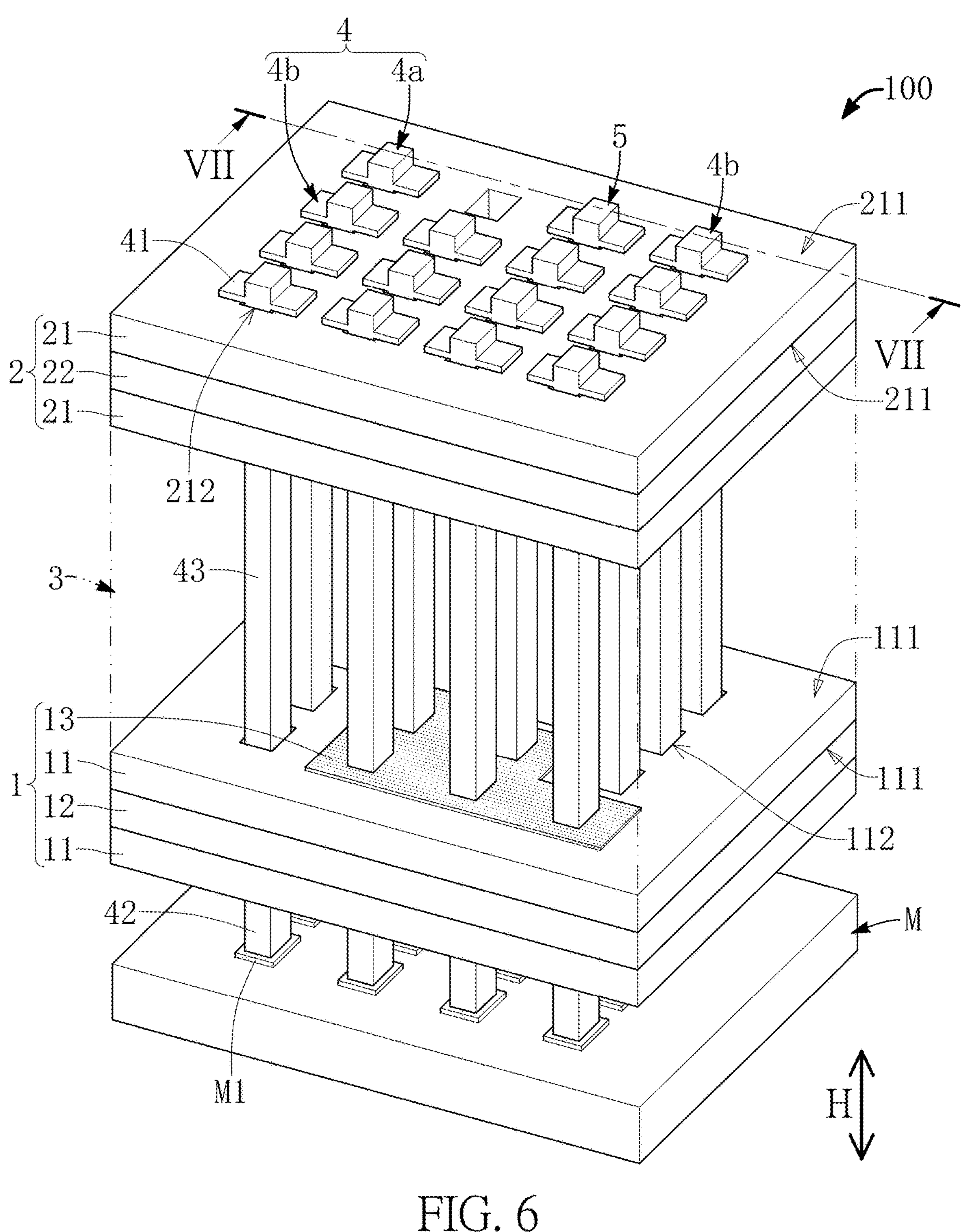
FIG. 6 is a schematic perspective view of the probe head of the probe card device according to a third embodiment of the present disclosure.
Figure 7:
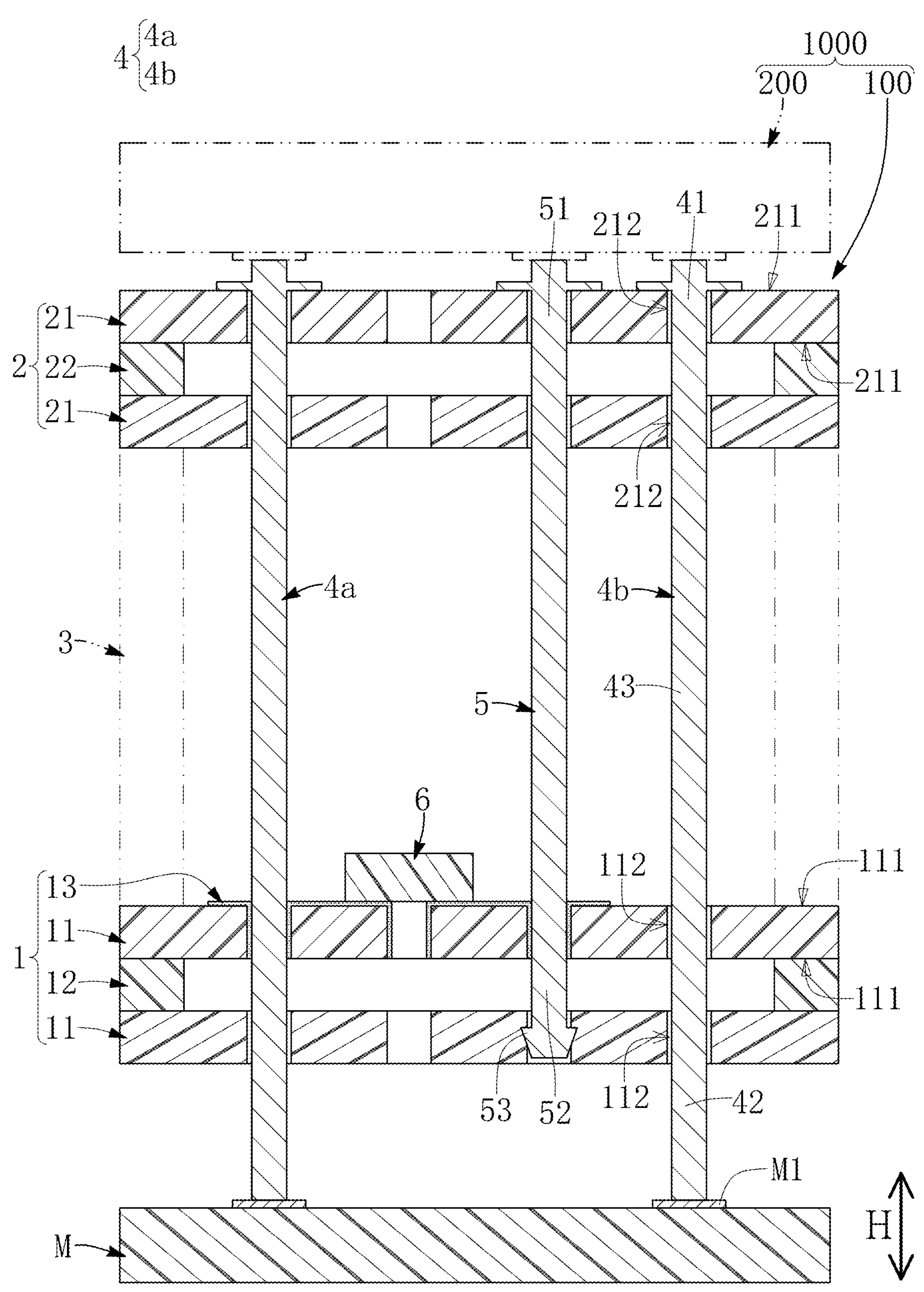
FIG. 7 is a schematic cross-sectional view taken along line VII-VII of FIG. 6.
Figure 8:
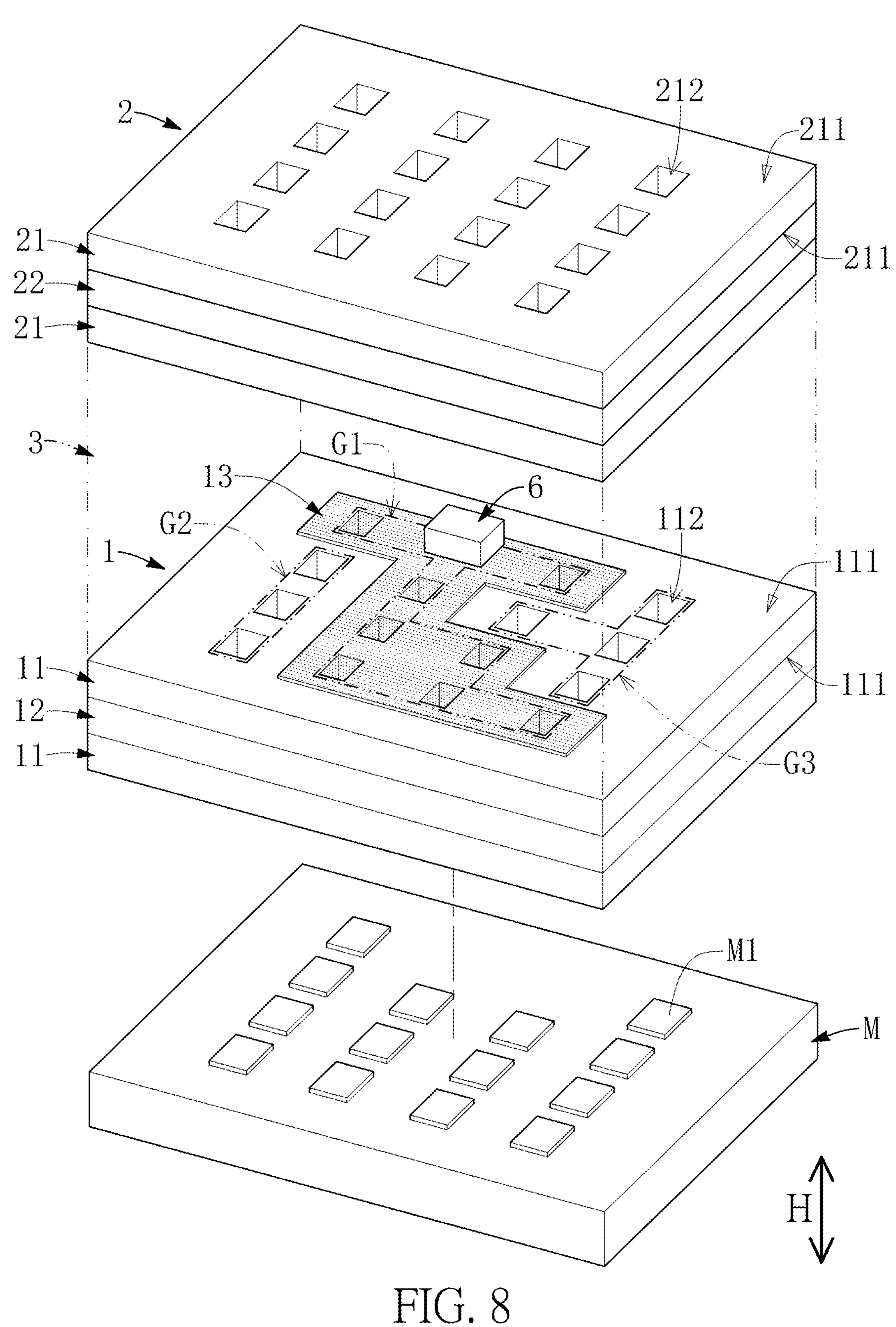
FIG. 8 is a schematic perspective view showing a part of the probe head of FIG. 6.

Referring to FIG. 6, a third embodiment of the present disclosure, which is similar to the second embodiment of the present disclosure, is provided. For the sake of brevity, descriptions of the same components in the first to third embodiments of the present disclosure will be omitted herein, and the following description only discloses different features between the second and third embodiments.

In the present embodiment, the probe card device 1000 further includes a first electronic component 6 (e.g., a passive component) connected to the connection circuit 13. The first electronic component 6 is assembled to the one of the two first guide boards 11 provided with the connection circuit 13 formed thereon, and the auxiliary probe 6 is electrically coupled to the corresponding conductive probe 4 through the connection circuit 13 and the first electronic component 6.

Specifically, in a cross section of the probe card device 1000 perpendicular to the thickness direction H and passing through the first electronic component 6, the conductive probes 4, the auxiliary probe 5, and the first electronic component 6 are in a matrix arrangement. Moreover, in the one of the two first guide board 11 provided with the connection circuit 13 formed thereon, the first electronic component 6 and the first thru-holes 112 are jointly in a matrix arrangement, and a portion of the DUT M facing toward the first electronic component 6 along the thickness direction H does not have any metal pad M1 arranged thereon.

Fourth Embodiment

Figure 9:
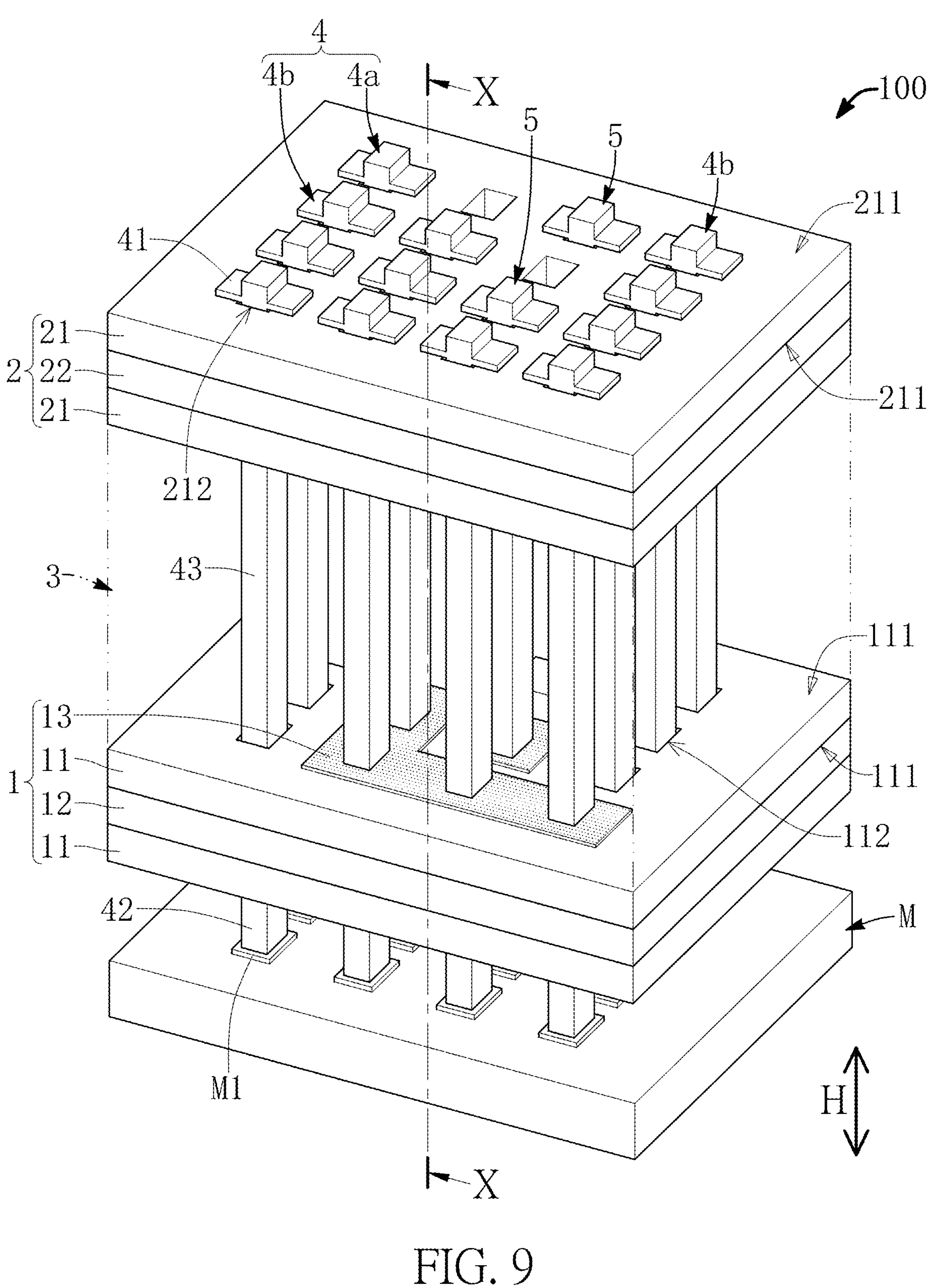
FIG. 9 is a schematic perspective view of the probe head of the probe card device according to a fourth embodiment of the present disclosure.
Figure 10:
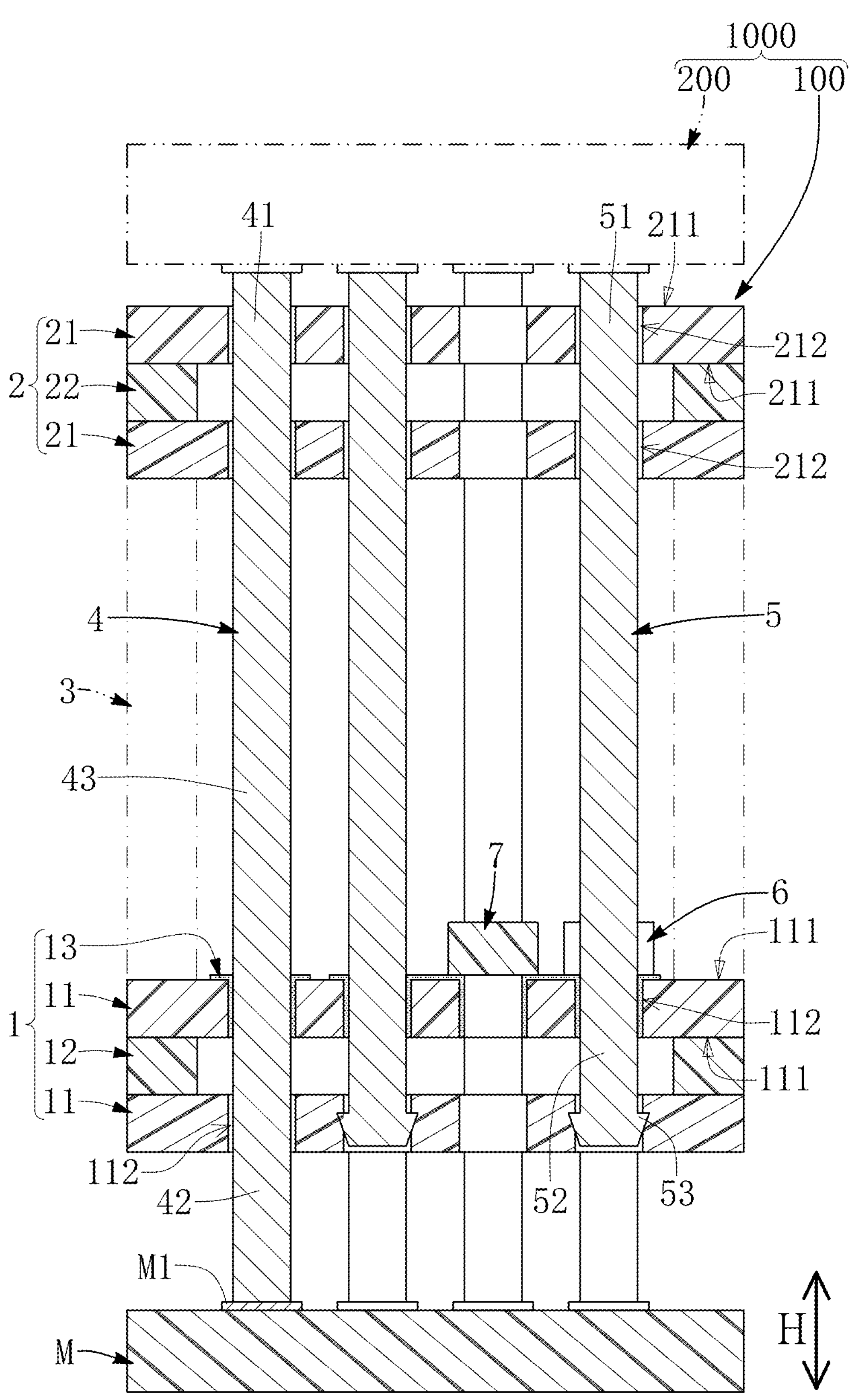
FIG. 10 is a schematic cross-sectional view taken along line X-X of FIG. 9.
Figure 11:
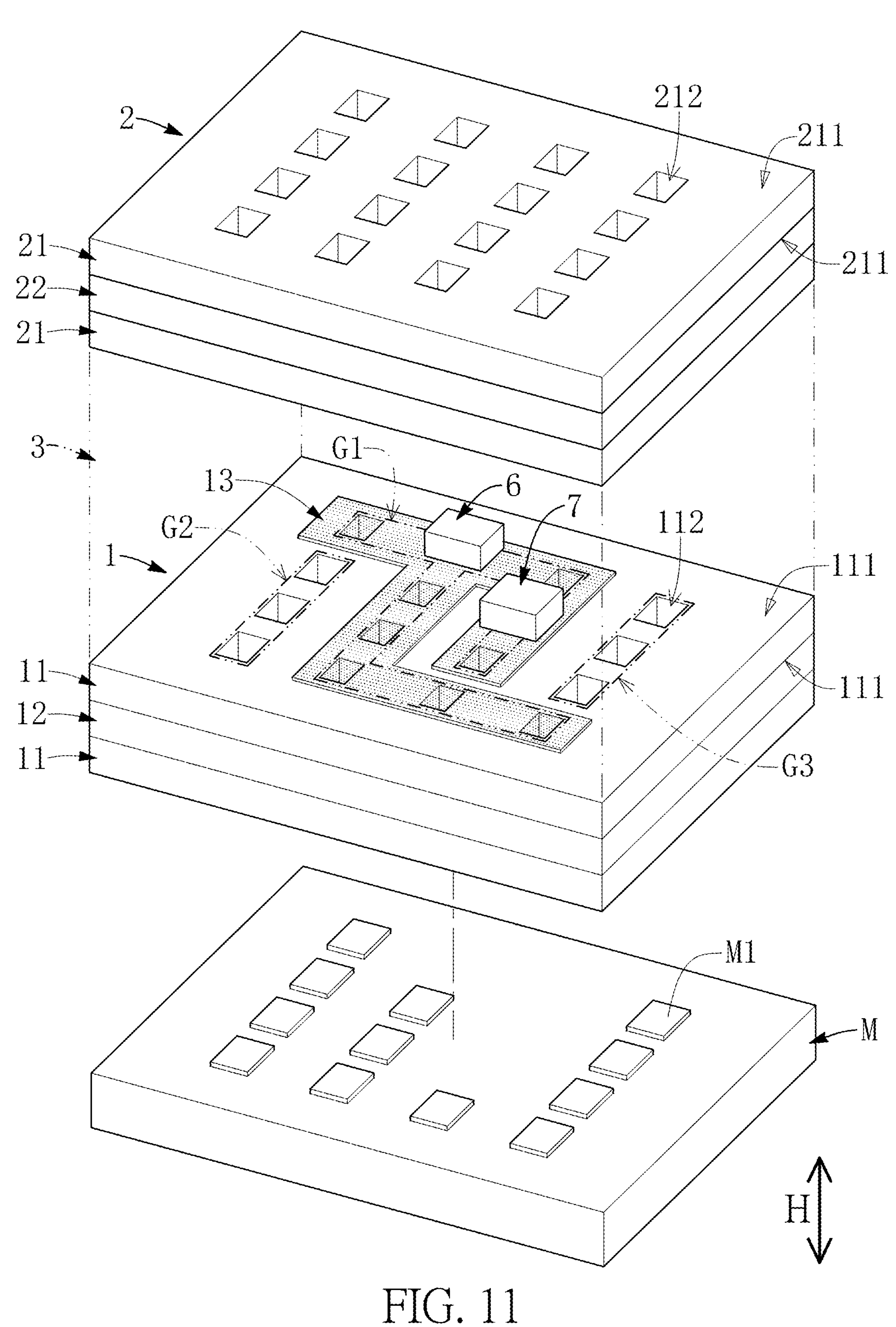
FIG. 11 is a schematic perspective view showing a part of the probe head of FIG. 9.

Referring to FIG. 9 to FIG. 11, a fourth embodiment of the present disclosure, which is similar to the third embodiment of the present disclosure, is provided. For the sake of brevity, descriptions of the same components in the third and fourth embodiments of the present disclosure will be omitted herein, and the following description only discloses different features between the third and fourth embodiments.

In the present embodiment, a quantity of the auxiliary probe 5 in the probe card device 1000 is more than one, and the auxiliary probes 5 are connected to the connection circuit 13. Moreover, the probe card device 1000 (or the probe head 100) in the present embodiment further includes a second electronic component 7 (e.g., a passive component) that is connected to the connection circuit 13. The second electronic component 7 is connected to the one of the two first guide boards 11 provided with the connection circuit 13 formed thereon, and the second electronic component 7 is located between the two auxiliary probes 5 adjacent to each other, such that the second electronic component 7 is electrically coupled to the two auxiliary probes 5 adjacent to each other through the connection circuit 13.

Beneficial Effects of the Embodiments

In conclusion, any one of the probe head and the probe card device in the present disclosure is provided with the at least one auxiliary probe that is not in contact with the DUT, such that the at least one auxiliary probe can be used to cooperate with at least one of the conductive probes electrically coupled thereto for meeting the electrical requirements, thereby effectively increasing the testing performance of the probe card device.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device having an expansion configuration, comprising:
- a circuit board;
- a first guide board module including a connection circuit;
- a second guide board module spaced apart from the first guide board module along a thickness direction and arranged between the circuit board and the first guide board module;
- a plurality of conductive probes assembled to the first guide board module and the second guide board module, wherein at least one of the conductive probes abuts against the connection circuit, and each of the conductive probes includes:
  - a fixing segment protruding from the second guide board module and fixed to the circuit board; and
  - a testing segment protruding from the first guide board module and configured to detachably abut against one of metal pads of a device under test (DUT); and
- at least one auxiliary probe assembled to the first guide board module and the second guide board module, wherein the at least one auxiliary probe abuts against the connection circuit so as to be electrically coupled to the at least one of the conductive probes, and wherein the at least one auxiliary probe includes:
  - a connection segment protruding from the second guide board module and fixed to the circuit board; and
  - an assembling segment fixed in the first guide board module, wherein the assembling segment is configured to face toward the DUT along the thickness direction and is not in contact with the DUT.

2. The probe card device according to claim 1, wherein a quantity of the conductive probes is equal to a quantity of the metal pads of the DUT, and a portion of the DUT facing toward the at least one auxiliary probe along the thickness direction does not have any metal pad arranged thereon.

3. The probe card device according to claim 2, wherein the conductive probes and the at least one auxiliary probe are in a matrix arrangement.

4. The probe card device according to claim 1, wherein the conductive probes include a plurality of grounding probes and a plurality of signal probes, the grounding probes abut against the connection circuit, the signal probes are defined into two probe groups, and the two probe groups are separated from each other through the grounding probes, the connection circuit, and the at least one auxiliary probe.

5. The probe card device according to claim 1, wherein an outer diameter of the at least one auxiliary probe is equal to an outer diameter of any one of the conductive probes.

6. The probe card device according to claim 1, further comprising:
- a spacer sandwiched between the first guide board module and the second guide board module; and
- a first electronic component connected to the connection circuit, wherein the at least one auxiliary probe is electrically coupled to the at least one of the conductive probes through the connection circuit and the first electronic component.

7. The probe card device according to claim 6, wherein, in a cross section of the probe card device perpendicular to the thickness direction and passing through the first electronic component, the conductive probes, the at least one auxiliary probe, and the first electronic component are in a matrix arrangement.

8. The probe card device according to claim 6, wherein a quantity of the at least one auxiliary probe is more than one, and the auxiliary probes are connected to the connection circuit, and wherein the probe card device further includes a second electronic component that is connected to the connection circuit and that is arranged between two of the auxiliary probes adjacent to each other.

9. A probe head of a probe card device having an expansion configuration, comprising:

a first guide board module including a connection circuit;

a second guide board module spaced apart from the first guide board module along a thickness direction;

a plurality of conductive probes assembled to the first guide board module and the second guide board module, wherein at least one of the conductive probes abuts against the connection circuit, and each of the conductive probes includes:

a fixing segment protruding from the second guide board module; and a testing segment protruding from the first guide board module and configured to detachably abut against one of metal pads of a device under test (DUT); and at least one auxiliary probe assembled to the first guide board module and the second guide board module, wherein the at least one auxiliary probe abuts against the connection circuit so as to be electrically coupled to the at least one of the conductive probes, and wherein the at least one auxiliary probe includes an assembling segment fixed in the first guide board module, and wherein the assembling segment is configured to face toward the DUT along the thickness direction and is not in contact with the DUT.

10. The probe head according to claim 9, further comprising:

a spacer sandwiched between the first guide board module and the second guide board module; and a first electronic component connected to the connection circuit, wherein the at least one auxiliary probe is electrically coupled to the at least one of the conductive probes through the connection circuit and the first electronic component;

wherein, in a cross section of the probe card device perpendicular to the thickness direction and passing through the first electronic component, the conductive probes, the at least one auxiliary probe, and the first electronic component are in a matrix arrangement.

* * * * *